(12) United States Patent
Chernyak et al.

(10) Patent No.: US 11,054,312 B2
(45) Date of Patent: Jul. 6, 2021

(54) RADIATION-DEFECT MITIGATION IN INAS/GASB STRAINED-LAYER SUPERLATTICE INFRARED DETECTORS AND RELATED METHODS

(71) Applicant: UNIVERSITY OF CENTRAL FLORIDA RESEARCH FOUNDATION, INC., Orlando, FL (US)

(72) Inventors: Leonid Chernyak, Orlando, FL (US); Robert E. Peale, Winter Park, FL (US); Christopher J. Fredricksen, Orlando, FL (US); Jonathan Lee, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 225 days.

(21) Appl. No.: 16/260,861

(22) Filed: Jan. 29, 2019

(65) Prior Publication Data
US 2019/0234803 A1 Aug. 1, 2019

Related U.S. Application Data

(60) Provisional application No. 62/623,132, filed on Jan. 29, 2018.

(51) Int. Cl.
*G01J 5/06* (2006.01)
*H01L 31/02* (2006.01)
(Continued)

(52) U.S. Cl.
CPC . *G01J 5/06* (2013.01); *G01J 5/24* (2013.01); *H01L 27/1462* (2013.01); *H01L 27/1465* (2013.01); *H01L 27/1469* (2013.01); *H01L 27/14694* (2013.01); *H01L 31/02019* (2013.01); *H01L 31/0304* (2013.01); *H01L 31/035236* (2013.01); *H01L 31/109* (2013.01);
(Continued)

(58) Field of Classification Search
None
See application file for complete search history.

(56) References Cited

U.S. PATENT DOCUMENTS 5,359,186 A * 10/1994 Fonash ............... G01T 1/24
250/214 PR
5,440,130 A 8/1995 Cox et al.
(Continued)

OTHER PUBLICATIONS

Chernyak et al., "Electron Beam Induced Current Measurements of Minority Carrier Diffusion Length in Gallium Nitride" Appl. Phys. Lett. 69, 2531 (1996) pp. 4.
(Continued)

*Primary Examiner* — Hoon K Song
(74) *Attorney, Agent, or Firm* — Allen, Dyer, Doppelt + Gilchrist, PA

(57) ABSTRACT

An IR sensor device may include an IR image sensor having an array of IR sensing pixels, and a readout circuit coupled to the IR image sensor and configured to sense sequential images. The IR sensor device may include a controller coupled to the readout circuit and configured to cause the readout circuit to apply a voltage to the IR image sensor between sensing of the sequential images.

20 Claims, 14 Drawing Sheets

(51) Int. Cl.
  *H01L 27/146* (2006.01)
  *H01L 31/0352* (2006.01)
  *H01L 31/18* (2006.01)
  *H01L 31/109* (2006.01)
  *H01L 31/0304* (2006.01)
  *G01J 5/24* (2006.01)
  *G01J 5/20* (2006.01)
  *G01J 5/00* (2006.01)

(52) U.S. Cl.
  CPC .......... *H01L 31/184* (2013.01); *H01L 31/186* (2013.01); *G01J 2005/0077* (2013.01); *G01J 2005/067* (2013.01); *G01J 2005/202* (2013.01)

(56) References Cited

U.S. PATENT DOCUMENTS

| | | | |
|---|---|---|---|
| 5,576,561 | A | 11/1996 | Colella et al. |
| 6,515,285 | B1 | 2/2003 | Marshall et al. |
| 2003/0038332 | A1* | 2/2003 | Kimura ..................... G01J 1/44 257/467 |
| 2005/0007473 | A1* | 1/2005 | Theil ..................... H04N 5/3597 348/308 |
| 2013/0107088 | A1* | 5/2013 | Minami ................. H04N 5/378 348/294 |
| 2018/0294309 | A1* | 10/2018 | Wei ..................... H01L 27/1443 |

OTHER PUBLICATIONS

Chernyak et al., "Electron injection-induced effects in GaN: Physics and Applications" MRS Spring Meeting Proc. 764, C5.4 (2003) Abstract Only.

Chernyak et al., "Phototransistor measurements in AlGaN/GaN HBTs" Electron. Lett. 37, 1411 (2001)pp. 2.

* cited by examiner

US 11,054,312 B2

RADIATION-DEFECT MITIGATION IN INAS/GASB STRAINED-LAYER SUPERLATTICE INFRARED DETECTORS AND RELATED METHODS

GOVERNMENT RIGHTS

This invention was made with Government support under HQ0147-17-C-7256 awarded by Missile Defense Agency. The Government has certain rights in the invention.

RELATED APPLICATION

This application is based upon prior filed Application No. 62/623,132 filed Jan. 29, 2018, the entire subject matter of which is incorporated herein by reference in its entirety.

TECHNICAL FIELD

The present disclosure relates to the field of image sensors, and, more particularly, to infrared image sensors and related methods.

BACKGROUND

Infrared (IR) detectors are useful in many applications. Nevertheless, in some applications, the IR detectors may be exposed to some high doses of radiation, such as gamma radiation, for example. One problem with this radiation exposure is the undesirable degradation of performance of the IR detector. For example, the photoresponse of the IR detector may decrease, and the minority carrier diffusion length, which is a critical parameter defining the photoresponse, may also decrease.

SUMMARY

Generally, an IR sensor device may include an IR image sensor comprising an array of IR sensing pixels, and a readout circuit coupled to the IR image sensor and configured to sense a plurality of sequential images. The IR sensor device may include a controller coupled to the readout circuit and configured to cause the readout circuit to apply a voltage to the IR image sensor between sensing of the plurality of sequential images.

More specifically, the controller may be configured to cause the readout circuit to apply the voltage comprising a forward bias voltage. The controller may be configured to cause the readout circuit to apply the voltage periodically between sensing of the plurality of sequential images.

Additionally, the IR image sensor may comprise an anti-reflective layer, a window layer below the anti-reflective layer, and an absorber layer below the window layer. The readout circuit may be configured to apply the voltage for forward bias electron injection into the absorber layer to increase the minority carrier diffusion length.

For example, the readout circuit may be configured to apply the voltage to generate a current density less than 1 mA/cm$^2$. The readout circuit may be configured to apply the voltage with a value of less than 0.75 Volts. The IR image sensor may comprise at least one of a long-wave infrared (LWIR) sensor, a mid-wave infrared (MWIR) sensor, and a short wave infrared (SWIR) sensor. The IR image sensor comprises a Strained-Layer-Superlattice (SLS) made from InAs, GaSb, or other III-V semiconductor compounds, and their combinations.

Another aspect is directed to a method for making an IR sensor device, the IR sensor device to mitigate radiation damage. The method may include forming an IR image sensor comprising an array of IR sensing pixels, and coupling a readout circuit to the IR image sensor and configured to sense a plurality of sequential images. The method may comprise coupling a controller to the readout circuit, the controller configured to cause the readout circuit to apply a forward voltage to the IR image sensor between sensing of the plurality of sequential images.

DETAILED DESCRIPTION

Figure 1A:
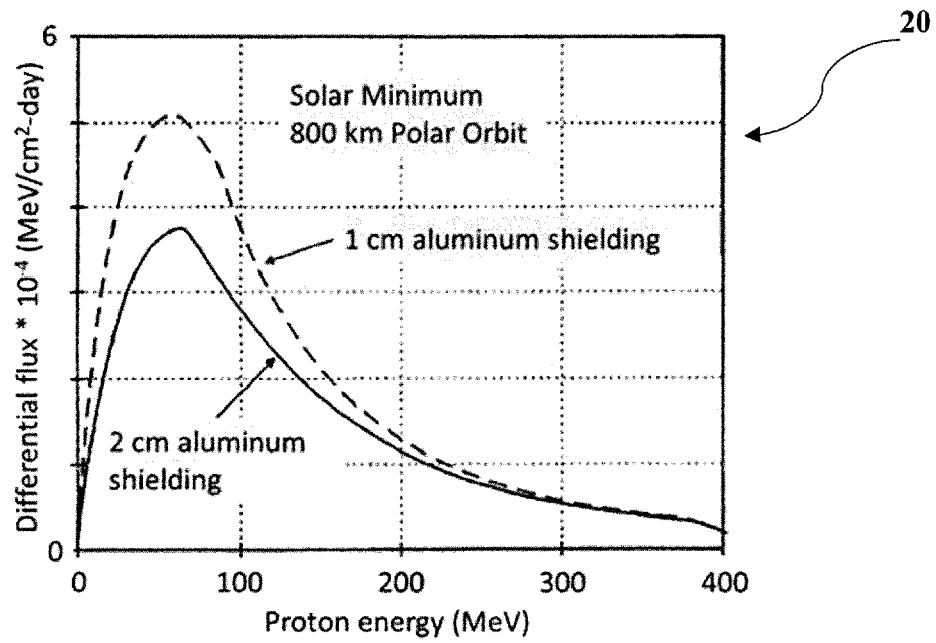
FIG. 1A is a diagram of an effect of shielding on the energy flux density due to energetic protons on a detector 800 km polar orbit at solar minimum, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

The present disclosure presents a strategy for mitigating radiation damage in GaSb/InAs Type II SLS LWIR detectors. The present disclosure's mitigation strategy can be optimized for detectors to be deployed in applications that will be exposed to radiation in the near-Earth orbital environment. Optimization can be realized on relevant hardware, using realistic operating and irradiation conditions. The mitigation treatment is purely electrical and can be applied in-situ, remotely, and automatically. The treatment can be applied during usual dead time between frames of an imager, using only voltages and currents available from commercial off-the-shelf read-out-integrated-circuits (ROICs) for SLS imagers. Thus, the mitigation treatment can have no impact on the weight or volume of detector and electronics, can result in zero increase in inoperative periods, and might not significantly increase the power budget. The treatment can quickly restore photoresponse to pre-irradiation levels and stably maintain it.

The radiation-defect mitigation treatment comprises forward bias injection of minority carriers into the absorber layer of the detector. Required current densities are <10 $pA/\mu m^2$ (1 $mA/cm^2$) and voltages are <0.75 V dropped across active layers. The physical mechanism of mitigation may be due to the filling of non-equilibrium (generated by IR illumination) carrier traps and passivation of gap levels, which exist both intrinsically and because of irradiation. The mitigation treatment increases minority carrier lifetime, minority carrier diffusion length, and hence detector quantum efficiency.

The present disclosure may provide the benefit of the invention on so-called pBn, pBiBn, and pBp structures in the form of unpatterned epi-layers on substrate. Experiments were performed at room temperature and without operational bias. Part of each wafer was reserved as a control, while the other part was subjected to 500 Gy of gamma radiation. The resulting radiation damage significantly degraded photoresponse. This degradation was attributed to a reduction in minority carrier diffusion length, which was directly measured by Electron Beam-Induced Current (EBIC) technique. The present disclosure's mitigation treatment dramatically restored both photoresponse and minority carrier diffusion length. Such treatment improved photoresponse even of non-irradiated samples, though the effect was larger in radiation-damaged samples. Without further mitigation treatments, the device performance declined slowly, requiring days to degrade back to pre-treatment levels. Thus, the improvement can be considered as perfectly stable over times that are long compared to detector dwell time during one frame. The treatment can be applied in short pulses at the frame rate, during typical dead time between frames, so that there is essentially no interruption of operation.

The present disclosed teachings are applicable to a wide range of detector designs obtained from multiple sources, such as Sandia National Labs, The Ohio State University, Northwestern University, and Jet Propulsion Laboratory (JPL). Fully-processed single-element detectors can be investigated under conditions that closely emulate those for detectors in high radiation space applications.

The most relevant radiation spectrum in near-earth orbit is 60 MeV protons. Proton irradiation creates both displacement and ionization damage. The effect on the detector performance and the response to the teachings herein may be different from those for the pure ionization damage caused by gamma irradiation. Proton irradiation can be performed using a medical cyclotron. Ideally, the detector should be maintained at operating temperatures and under typical operating bias during both irradiation and subsequent characterization, without warming up or removing bias.

The treatment will ultimately be constrained by the capabilities of commercial SLS ROICs. Ideally, the treatment requires low currents and voltages, and can be applied only during dead time between frames, to ensure the treatment does not increase off time.

A fundamental understanding of the radiation defects, their effect on minority carrier diffusion length and photoresponse, and the mitigation mechanism are useful. Low temperature proton irradiation under bias will create different radiation defects from those obtained using gamma irradiation during prior work. The mitigation treatment may be temperature dependent. Fundamental understanding can inform the present disclosure's mitigation strategy.

Figure 2A:
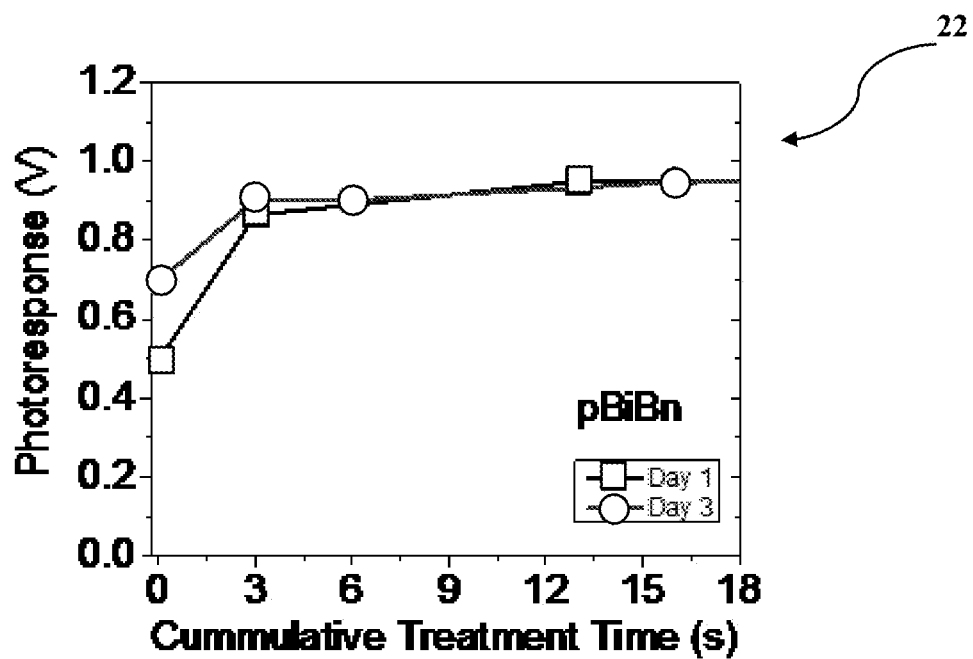
FIG. 2A is a diagram of photoresponse as a function of treatment duration for pBiBn structure, comparing the behavior of photoresponse due to cumulative treatment time initially and after 2 days of rest, according to the present disclosure.
Figure 2B:
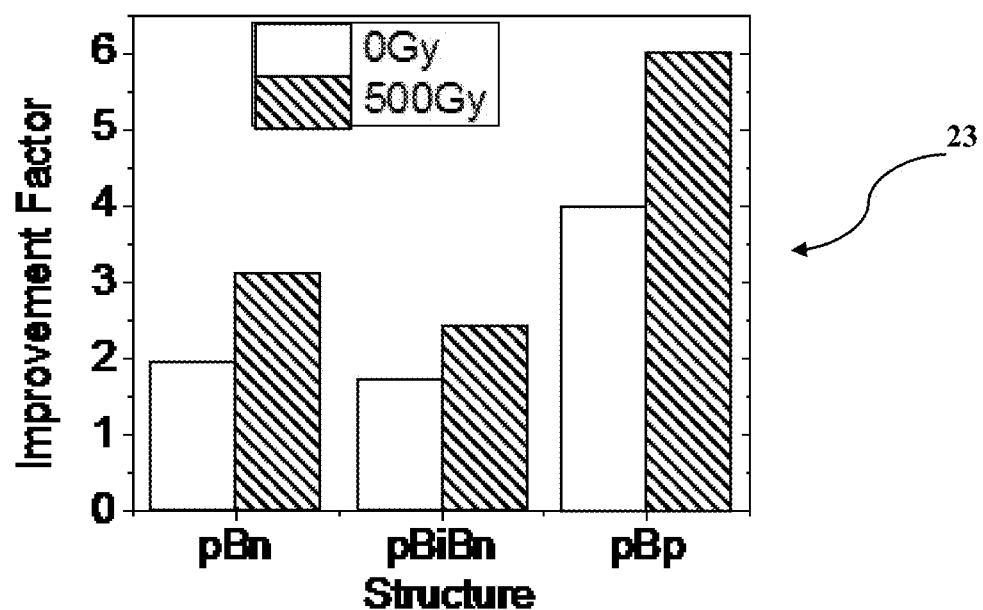
FIG. 2B is a diagram of photoresponse improvement factors for all three irradiated structures and their controls, according to the present disclosure.

FIG. 2A (diagram 22) presents the photoresponse as a function of cumulative treatment time on the pBiBn control sample. To simulate unobtrusive treatment during the dead time between frames of a 30 Hz imaging array, the treatment was applied in 1 ms intervals at 30 Hz repetition rate. Thus, a cumulative treatment time of 3 seconds means a total treatment "on time" of (1 ms/interval)*(30 intervals/second) *(3 seconds)=90 ms. The data represented by the red points were taken two days after those represented by black points, showing only partial return to the initial low-response state. The photoresponse improves with treatment, and the improvement saturates within a few seconds. These results show that after a single radiation burst event, the photoresponse can be recovered within seconds without undue inoperative periods. Or, if the radiation dose accumulates slowly, the treatment can maintain optimal photoresponse with much shorter intervals at lower repetition rates than those used for FIG. 2A, also without undue inoperative periods. FIG. 2B (diagram 23) shows the factor by which photoresponse was improved by the disclosed treatment for both irradiated and control samples of three different SLS structures.

Changes to spectral photoresponse, as might occur due to damage-induced changes to band structure and a, can be studied using an infrared spectrometer, characterizing the detector's own response at operating temperature and under bias. A liquid-nitrogen cryostat optical-access tailstock would be integrated with the sample compartment of a Fourier spectrometer. The modulated beam of the spectrometer would fall on the detector under test, whose response would be conditioned, amplified, and Fourier transformed to produce a responsivity spectrum of the detector.

Fundamental Science

Figure 3:
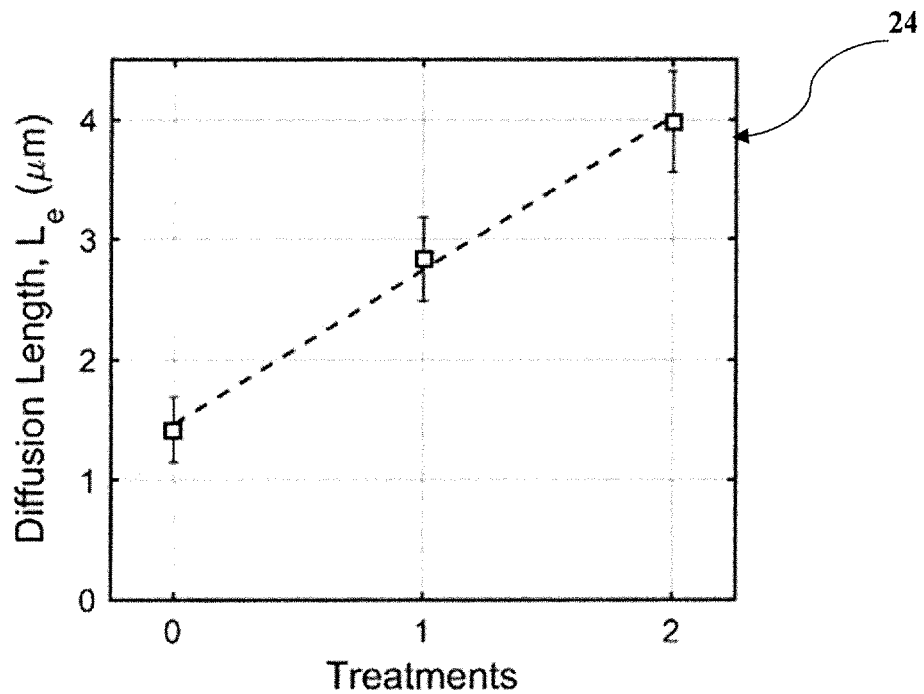
FIG. 3 is a diagram of minority carrier diffusion length in irradiated pBn structure as a function of treatment, according to the present disclosure.

The exemplary science investigations described here are to provide an understanding of the treatment effect. FIG. 3 (diagram 24) presents improvement with treatments in minority carrier diffusion length, L. These improvements are correlated with improvements in photoresponse R. In principle, a causal relationship between L and R can be established. A starting point for modeling this dependence would be $$R \sim 1 - e^{-\alpha W}/(1+\alpha L) \quad (1)$$

where α is absorption coefficient and W is depletion width [17]. R and L are independently measured as a function of irradiation and treatment, while W should be constant for constant operating conditions. The Equation (1) dependence can be verified, or some other dependence established, in control samples. Then deviations from that functional dependence caused by irradiation would suggest a change in α, due to changes in band structure. It would be important to understand whether a change in the functional relation between R and L is reversed after treatment, in addition to simply recovering R, and this information would be useful for optimizing the treatment.

FIG. 3 shows that improvement in L increases linearly with time during the initial treatments. The rate of improvement dL/dt may depend on temperature. Investigated treatments so far have been at room temperature, but they may occur at low operating temperature in space application. The temperature dependence of treatment may relate to an associated activation energy. Such thermally activated mitigation might follow an exponential dependence on treatment temperature and a linear dependence on treatment duration such as $$\Delta L = \text{const Exp}[+E_t/(kT_t)]\Delta t, \quad (2)$$

where $E_t$ is the treatment activation energy, k Boltzmann's constant, $T_t$ the treatment temperature, and $\Delta t$ the treatment duration [18]. According to Equation (2), improvement in L for fixed $\Delta t$ increases as temperature decreases.

Figure 4A:
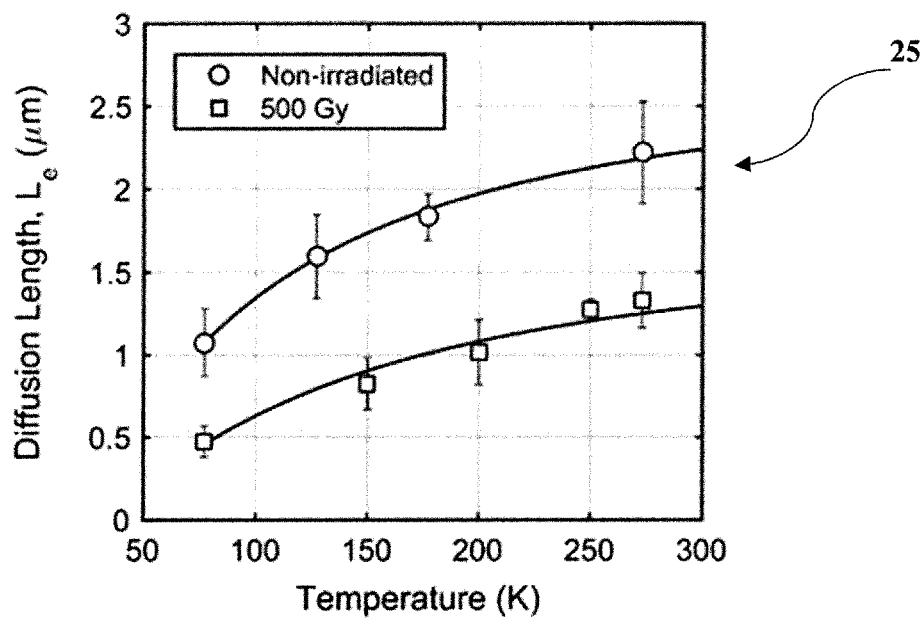
FIGS. 4A and 4B are diagrams of temperature dependence of minority carrier diffusion length with exponential fits for irradiated and control pBn samples on linear scale and Arrhenius plot, respectively, where activation energies $E_a$ are 13.1 and 18.6 meV for control and irradiated samples, respectively, according to the present disclosure.
Figure 4B:
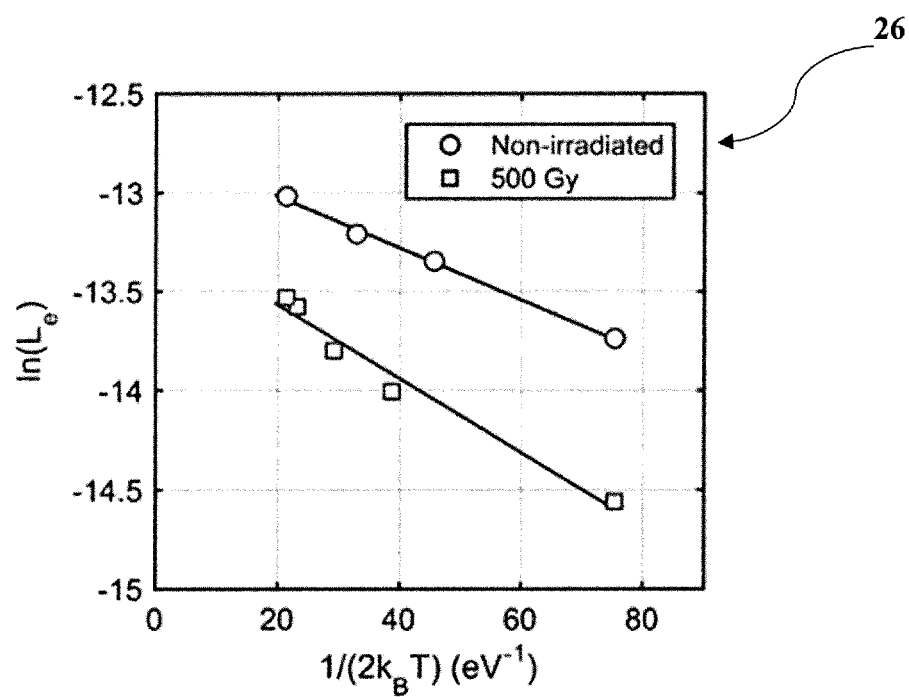

Minority carrier diffusion is known to be thermally activated, but with a negative exponent that depends on irradiation and treatment history, as shown diagrams 25, 26 in FIGS. 4A-4B, and according to [19]:

$$L = \text{const Exp}[-E_a/(2kT)]. \quad (3)$$

Arrhenius plot of Equation (3) gives the activation energy, $E_a$, which is a measure of deep level positions in the gap. Irradiation shifts the Arrhenius plot down and steepens its slope (FIGS. 4A-4B). Treatment shifts the curve back up and may also restore its slope. The dependence of that upward shift with $T_t$ follows its own Arrhenius plot, which gives $E_t$, if Eq. 2 holds. There could be a dependence on irradiation history, with treatment optimization effort.

There has been a persistent tail to photoresponse when the illumination source was turned off, which would affect detector speed and dark current. There may be a dependence on irradiation and treatment. In following, another discussion of exemplary embodiments is provided.

A successful mitigation strategy for radiation damaged Type II GaSb/InAs SLS IR detectors is reported. Minority carrier diffusion length and photoresponse, which were degraded by exposure to ionizing radiation, were restored by an in-situ purely-electrical treatment, which can be applied using commercial SLS ROIC without undue inoperative periods. Investigated layer structures of types pBn, pBiBn, and pBp all show similar behavior.

Introduction

Some IR detectors that are exposed to radiation during an application suffer degraded vision. The radiation dose may be a single burst from nuclear events or may accumulate in orbital environments in space-based applications. Negative effects of radiation damage on minority carrier diffusion length and photoresponse in SLS detector structures are observed. Feasibility of an in-situ process to restore function in radiation-damaged detectors was demonstrated. Photoresponse is restored through the engineered recovery of minority carrier diffusion length, which is one of the main parameters that define the quantum efficiency.

SLS photodetector structures were dosed with gamma radiation comparable to expectations for a shielded detector during several months in geosynchronous orbit [11]. Minority carrier diffusion length was directly measured using Electron Beam-Induced Current (EBIC) in both irradiated and non-irradiated structures. Radiation damage decreased the minority carrier diffusion length and degraded IR photoresponse. The disclosed mitigation process unambiguously restored both parameters. Moreover, it was demonstrated that the process can be applied using standard SLS ROIC compatibly with standard frame rates without undue inoperative periods. In other words, SLS detector performance can be maintained by the disclosed treatment without any modification to hardware, no increase in size or weight, and with minimal impact on power budget.

Methods, Assumptions, and Procedures

Figure 5A:
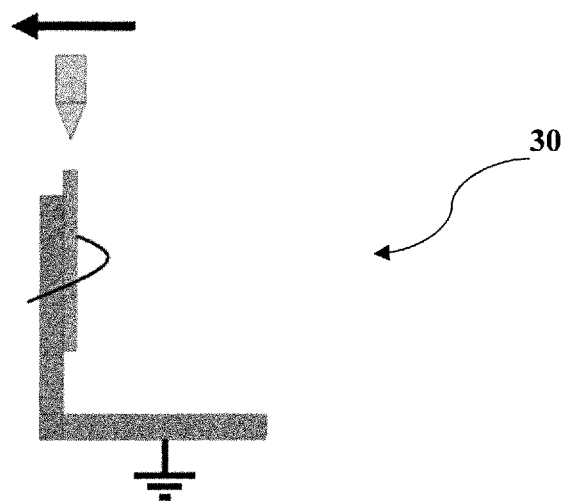
FIGS. 5A and 5B are diagrams of the experimental setup for EBIC measurements, according to the present disclosure.
Figure 5B:
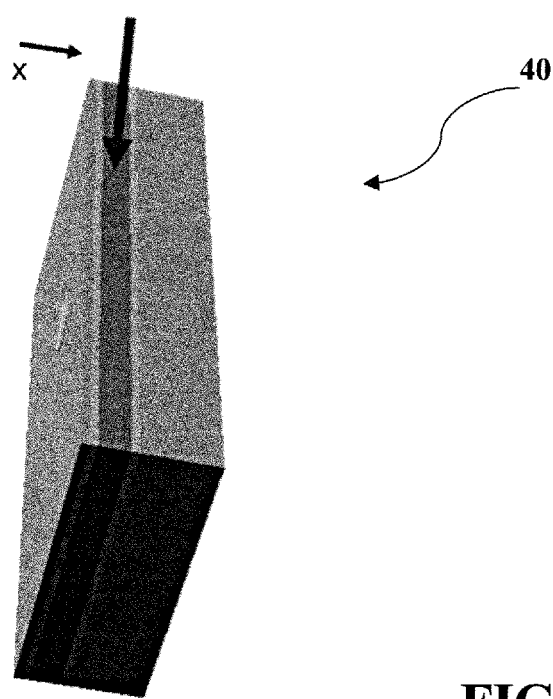

Three different sample structures were obtained in the form of unpatterned layers deposited on substrate handle wafers. The structure types were pBn, pBiBn, and pBp. These samples were cleaved, with one part of each sample sent out for irradiation (500 Gy gamma) and the other part held as a control. FIGS. 5A and 5B are diagrams 30, 40 of the experimental setup for EBIC measurements. The sample was mounted on the metal bracket (blue) with the cleaved surface facing up. The electron beam was scanned across the absorber layer in the direction shown. The induced current was amplified by a commercial current amplifier. A temperature-controlled stage maintained temperatures from 77 K to above room temperature.

Figure 6:
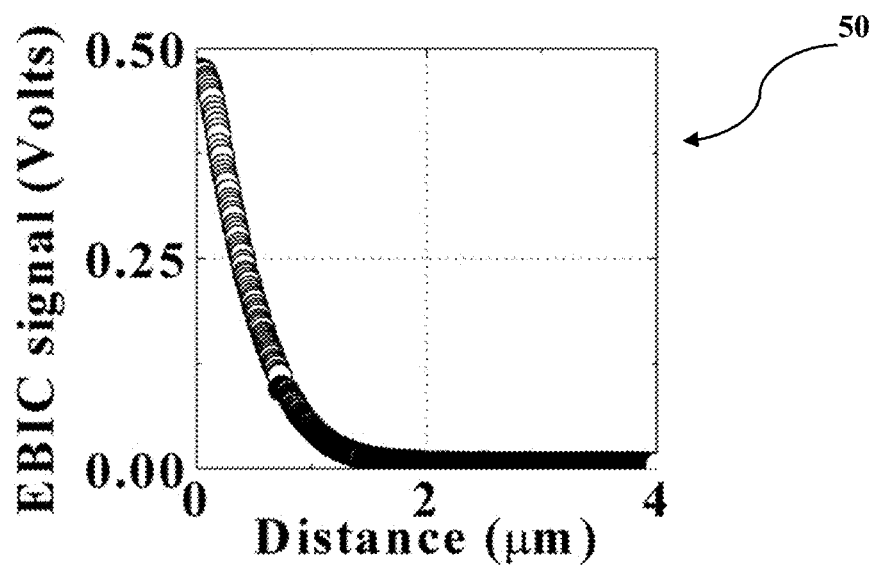
FIG. 6 is a diagram of a typical EBIC signal, according to the present disclosure.

FIG. 6 presents a diagram 50 with typical EBIC signal. The output of the current amplifier is plotted as a function of beam displacement x across the p-type absorber region of the SLS detector structure. The displacement x is measured from the junction between p-type absorber and the barrier B. EBIC signal is largest when the electron beam is located near x=0 at the junction, because then it is easy for the fields at the junction to collect the generated minority carriers. When the beam is located farther from the junction, the minority carriers must diffuse to the junction, and some of them recombine before reaching the junction, so the EBIC signal gets progressively weaker with increasing x. The dependence on x is exponential, and the characteristic length for the decay is the minority carrier diffusion length. Thus EBIC gives a direct measurement of minority carrier diffusion length. Using the mobility, one can also determine a value for the minority carrier lifetime.

Figure 7:
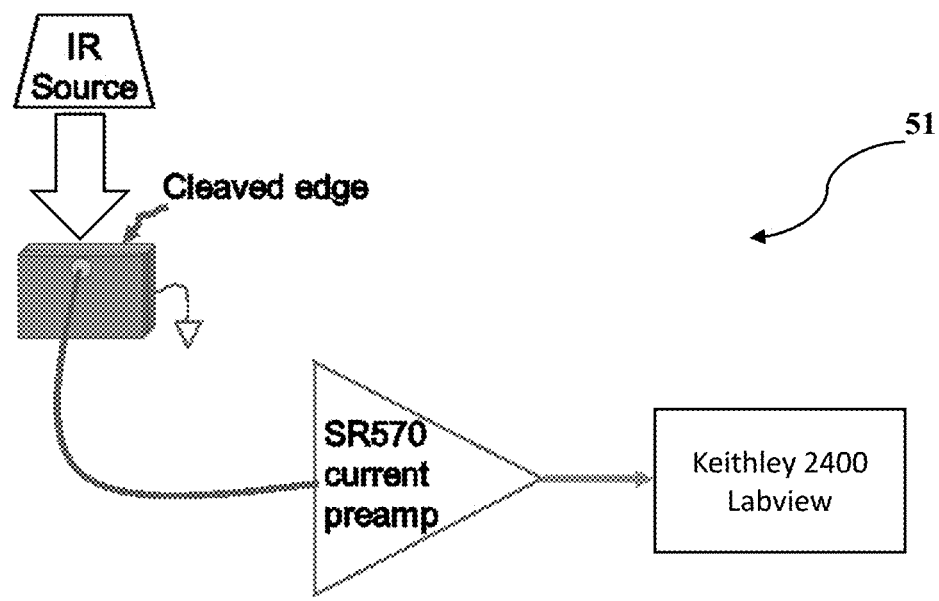
FIG. 7 is a diagram of a schematic of the photoresponse experimental set up, according to the present disclosure.

FIG. 7 presents a diagram 51 of the photoresponse experimental set up. A thermal IR source with an emission spectrum that peaks near 4 microns wavelength was used. Exposure of the cleaved edge of the SLS layer structure to this IR radiation generates minority electrons in the p-type absorber layer, which are separated from majority holes by the built-in field at the internal junction to generate a photo current. These measurements were performed at room temperature and without applied bias. The photo current was amplified using a commercial current preamp, whose output was measured using a source-meter and recorded using a Labview program on a laptop computer. Photoresponse was measured on each irradiated sample and on an un-irradiated control sample cleaved from the same wafer. Photoresponse was collected for a variety of defect-mitigation treatments to determine the optimum treatment compatible with the end application. For prior work, mitigation treatment and photoresponse measurements were alternated by switching between two circuits. While photo-response was being measured, mitigation treatment was not being applied, and vice versa.

Figure 8:
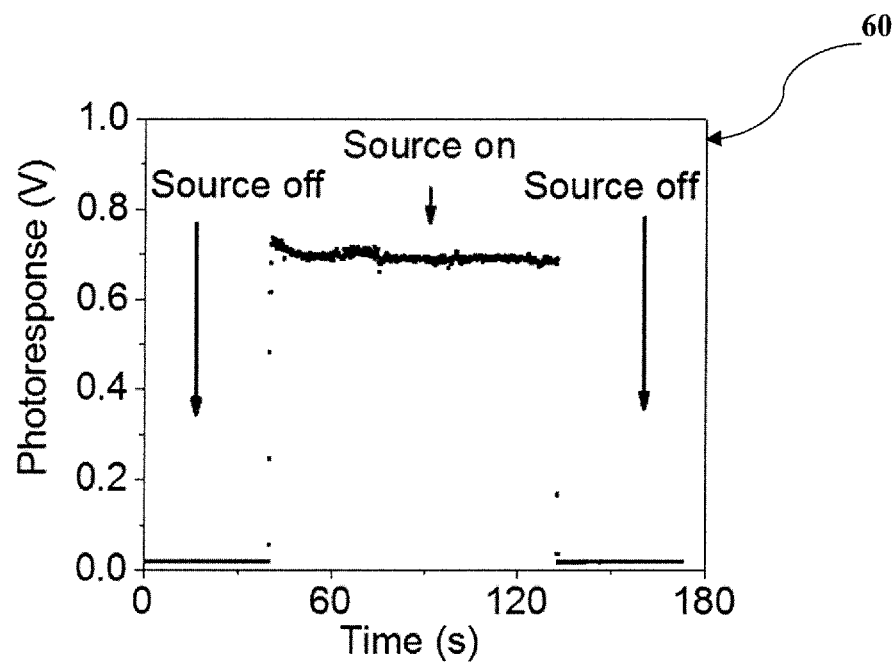
FIG. 8 is a diagram of a typical measurement cycle, according to the present disclosure.

FIG. 8 (diagram 60) shows a typical measurement cycle. First, baseline dark current was recorded with the source turned off. Then, the source was turned on, and a photocurrent was observed and recorded. Finally, the source was turned off, and the dark current measured again. The photoresponse value is determined from the difference between the photocurrent preamp output after the source stabilized and the dark current.

Figure 9:
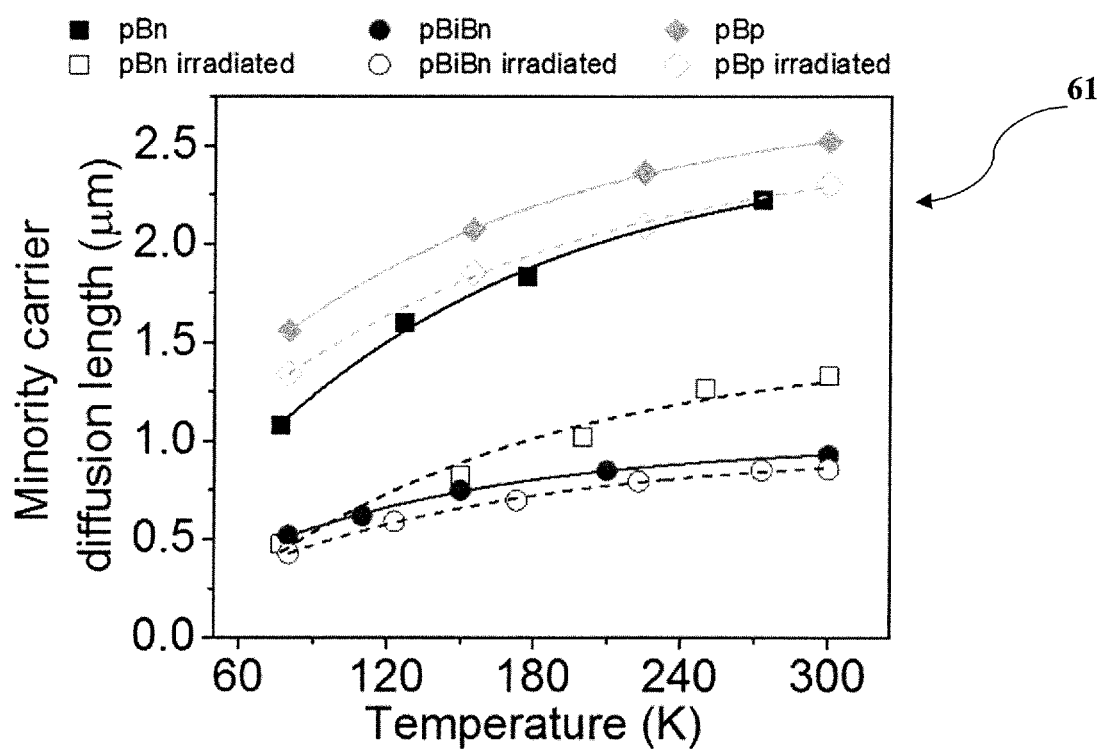
FIG. 9 is a diagram of temperature-dependence of minority carrier diffusion length L determined from EBIC measurements, according to the present disclosure.

FIG. 9 (diagram 61) presents temperature-dependence of minority carrier diffusion length L determined from EBIC measurements. L increases with temperature, as expected from observations on p-n junctions in other materials systems. An exponential fit according to $$L(T) = L_0 e^{-\left[\frac{E_a}{2k_B T}\right]}. \tag{4}$$

gives the asymptotic diffusion lengths $L_0$ and an activation energy $E_a$. The $k_B$ is Boltzmann's constant.

Figure 10:
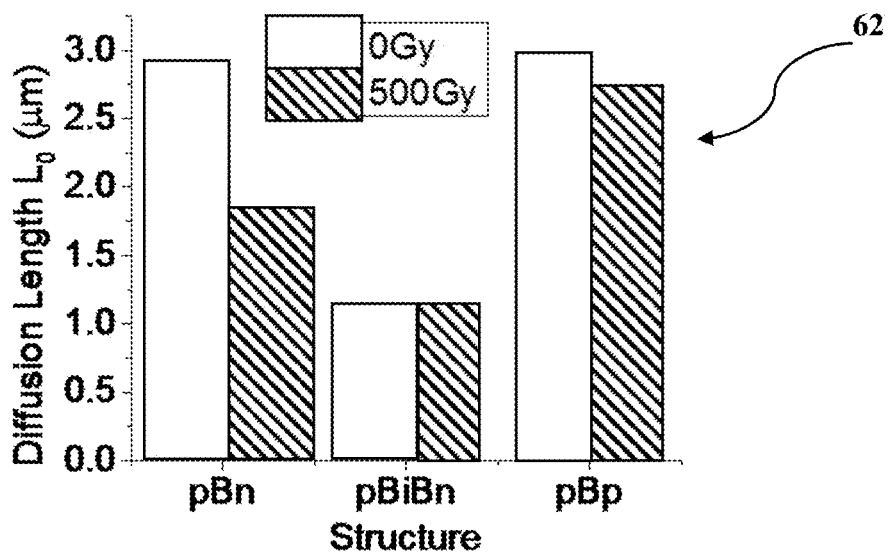
FIG. 10 is a diagram of values for $L_0$ in all three irradiated structures and their un-irradiated controls, according to the present disclosure.

FIG. 10 shows a diagram 62 comparing values for $L_0$ in all three irradiated structures and their un-irradiated controls. Irradiation shortened $L_0$ in all structures. This negative effect was strongest for the pBn structure, and it was rather weak for the pBiBn structure. A decrease in L should degrade photoresponse, because fewer photo-generated minority carriers are collected at the junction before they recombine.

Figure 11:
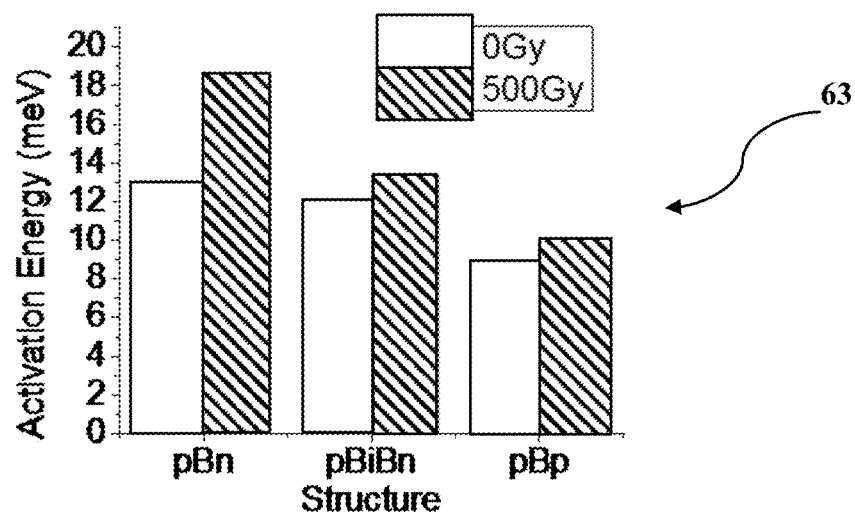
FIG. 11 is a diagram of thermal activation energies $E_a$, determined from the fits of Equation 4, according to the present disclosure.

The thermal activation energies $E_a$, determined from the fits of Equation 4 are compared in diagram 63 of FIG. 11. Irradiation consistently causes an increase in value of $E_a$. Again the effect is largest for the pBn structure, but it is comparable for pBiBn and pBp.

Figure 12:
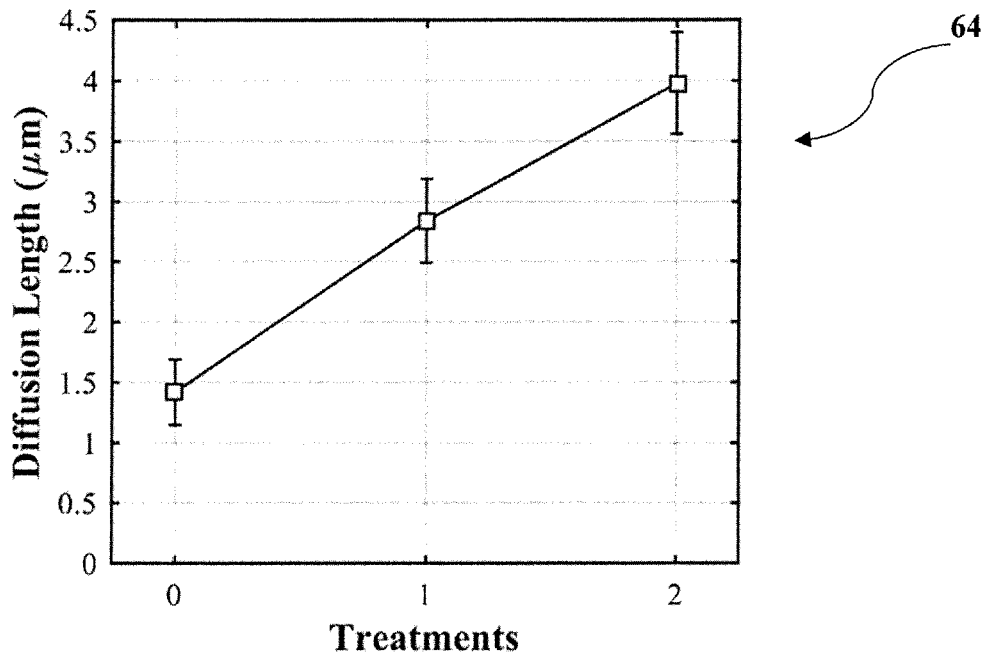
FIG. 12 is a diagram of room temperature values for L as a function of the number of mitigation treatments, from 0 to 2 for an irradiated pBn structure, according to the present disclosure.

FIG. 12 shows a diagram 64 of room temperature values for L as a function of the number of mitigation treatments, from 0 to 2 for an irradiated pBn structure. Diffusion length increases markedly, validating the hypothesis that the disclosed mitigation treatment improves minority carrier diffusion.

Figure 13:
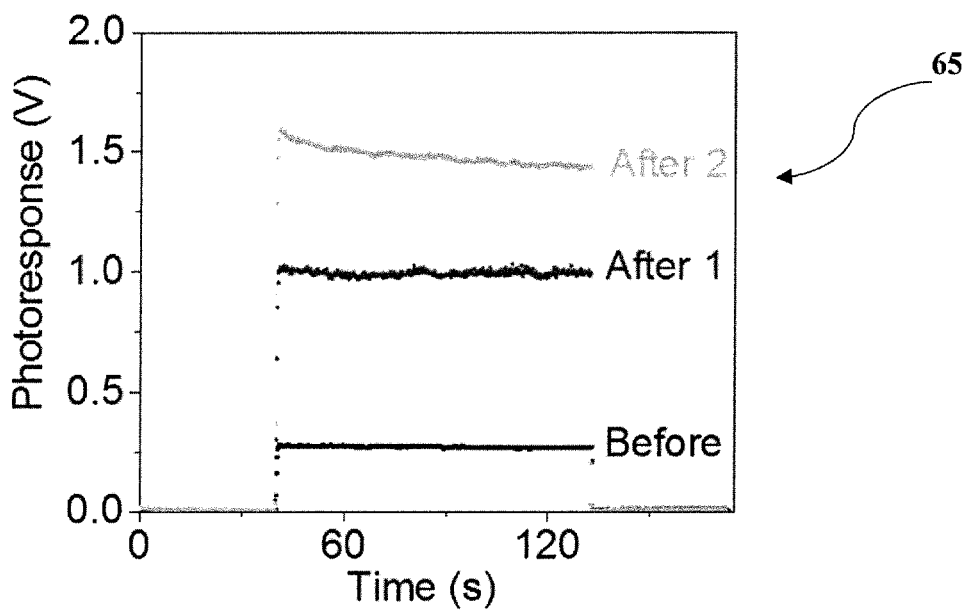
FIG. 13 is a diagram of example photoresponse data for the irradiated pBp structure, according to the present disclosure.

FIG. 13 shows a diagram 65 of example photoresponse data for the irradiated pBp structure. The black curve (Before) was measured before any treatment was applied, red (After 1) was measured after a series of short treatments and green (After 2) was measured after more treatments. The photoresponse improvement factor is the ratio of the "After" to the "Before" photoresponse signals. The value of the improvement factor depends on previous treatment history, as the samples require several days after treatments are applied to return to their original untreated condition. The largest improvement factors are obtained on the very first treatment or after the sample has been untreated for up to one week.

Figure 14:
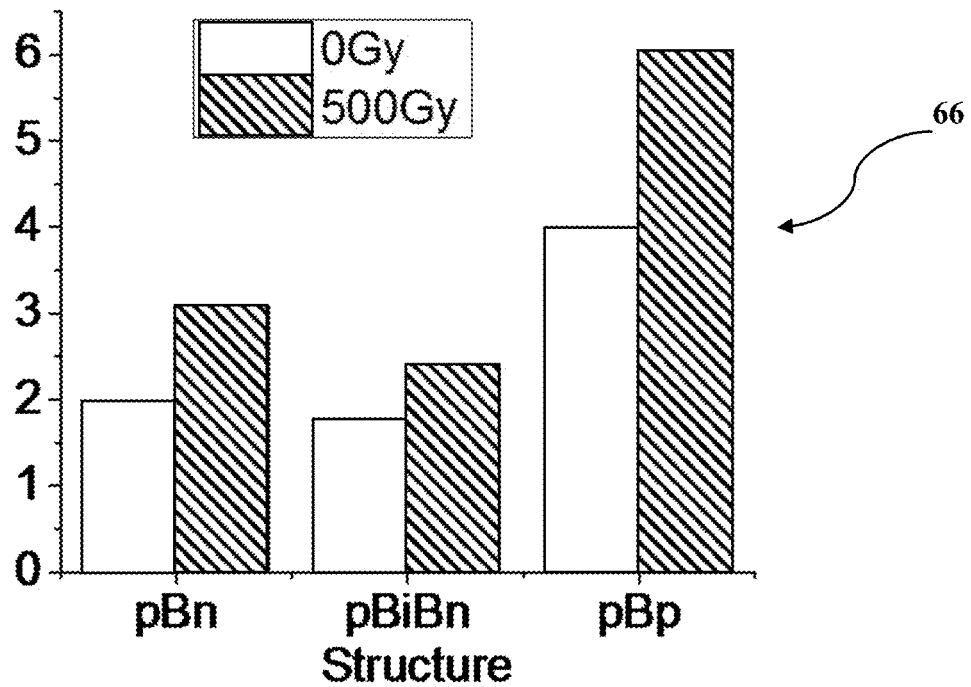
FIG. 14 is a diagram of photoresponse improvement factors for all three irradiated structures and their controls, according to the present disclosure.

FIG. 14 shows a diagram 66 comparing photoresponse improvement factors for all three irradiated structures and their controls. Improvement in photoresponse is attributed to an increase in L. For the three irradiated structures, the improvement factor ranges between 2.5 and 6 times. Interestingly, the un-irradiated samples also show an improvement after treatment. Thus, the treatment is effective on native defects as well as radiation defects. However, the improvement factors are consistently 1.5 times larger for the irradiated samples. The improvement factors for the pBp samples, both control and irradiated, was the largest.

Figure 15:
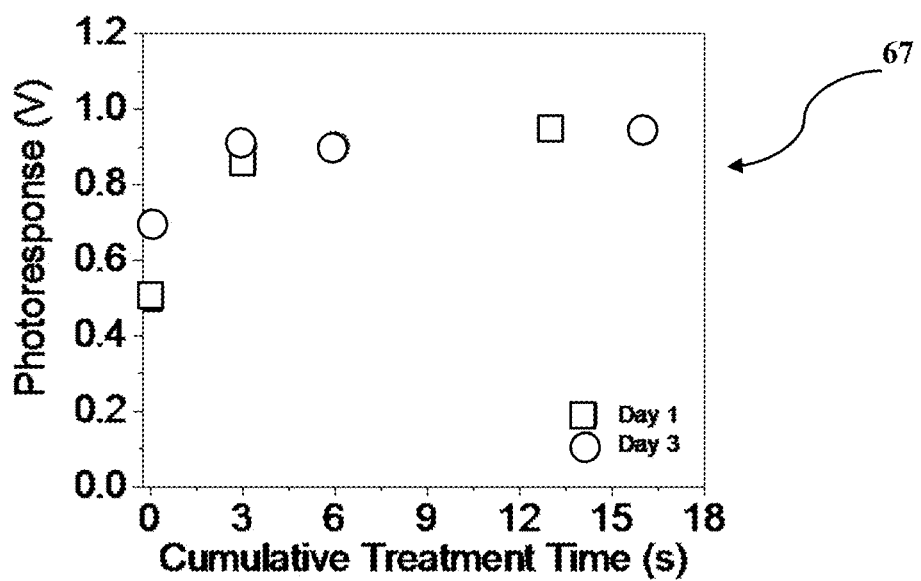
FIG. 15 is a diagram of the photoresponse as a function of cumulative treatment time on the pBiBn control, according to the present disclosure.

FIG. 15 shows a diagram 67 of the photoresponse as a function of cumulative treatment time on the pBiBn control. To simulate unobtrusive treatment during the dead time between frames of a 30 Hz imaging array, the treatment was applied in 1 ms pulses at 30 Hz repetition rate. Thus, a cumulative treatment time of 3 seconds means a total treatment "on time" of (1 ms/interval)*(30 intervals/second) *(3 seconds)=90 ms. The data represented by the red points were taken two days after those represented by black points, showing only partial return to the initial low-response state. The photoresponse improves with treatment, and the improvement saturates within a few seconds. These results show that after a single radiation burst event, the photo response can be recovered within seconds without undue inoperative periods. Or, if the radiation dose accumulates slowly, the treatment can maintain optimal photoresponse with much shorter pulses at lower repetition rates than those used for FIG. 15, also without undue inoperative periods.

CONCLUSIONS

The results presented strongly support effectiveness of the disclosed defect mitigation strategy for restoring and maintaining the photoresponse of radiation damaged SLS LWIR and MWIR) detectors. Experiments support that the treatment can be applied without changing hardware, without increasing size or weight, and with only minimal impact on power budget.

Figure 1B:
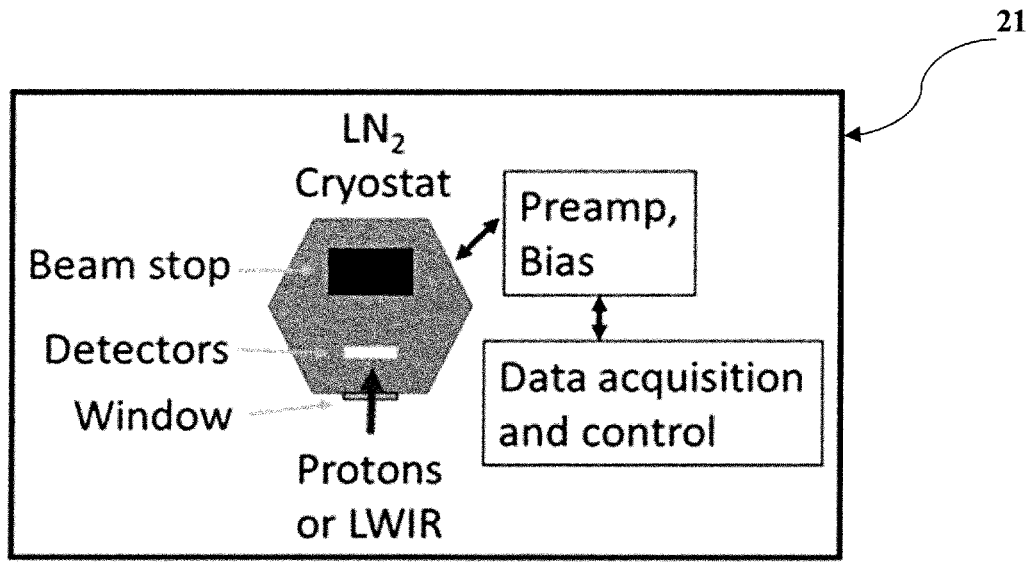
FIG. 1B is a schematic top view of an irradiation and characterization set up, according to the present disclosure.

Referring briefly to FIGS. 1A-1B, irradiation depends strongly on the orbit. Space-based imagers are usually in low earth orbit. Diagram 20 (FIG. 1A) shows the differential proton flux at 800 km. Protons near the 60 MeV peak penetrate 2 cm of aluminum shielding. Diagram 21 (FIG. 1B) shows an exemplary set-up for irradiation and characterization. Fluences of 6.2 to 620 Gigaprotons/cm$^2$ at 80 MeV provide 1 to 100 krad(Si) absorbed dose, which is comparable to doses in previous studies on nBn arrays [14]. (Stopping power S/ρ in silicon for 80 MeV protons is ~10 MeV/g/cm$^2$ [15]. Absorbed dose, D, from a fluence, Φ, of 620 Gp/cm$^2$ is D=0.1602 Φ S/ρ ~1000 Gy(Si)=100 krad(Si), in agreement with [14].)

Figure 16:
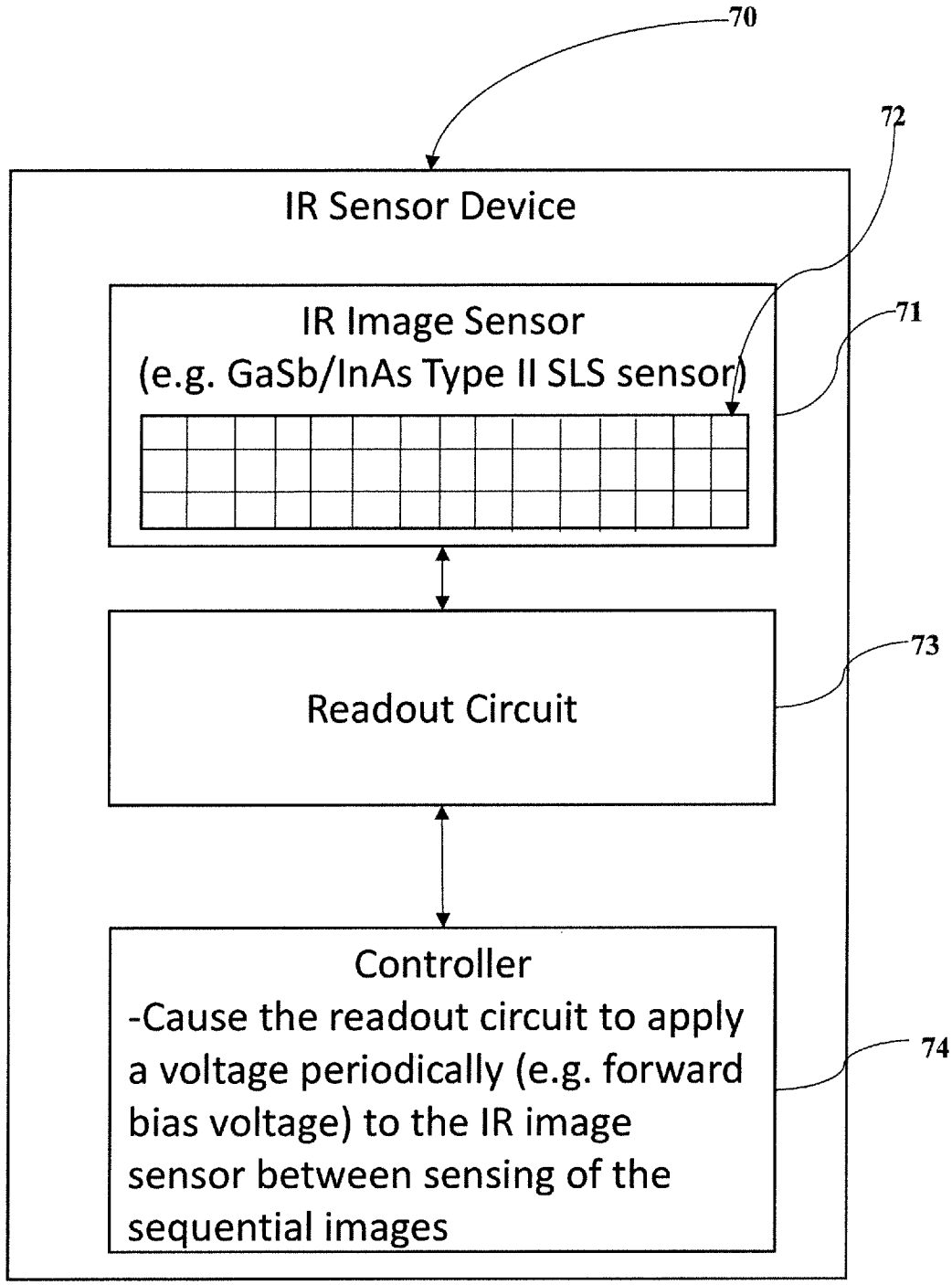
FIG. 16 is a schematic diagram of the IR sensor device, according to the present disclosure.
Figure 17:
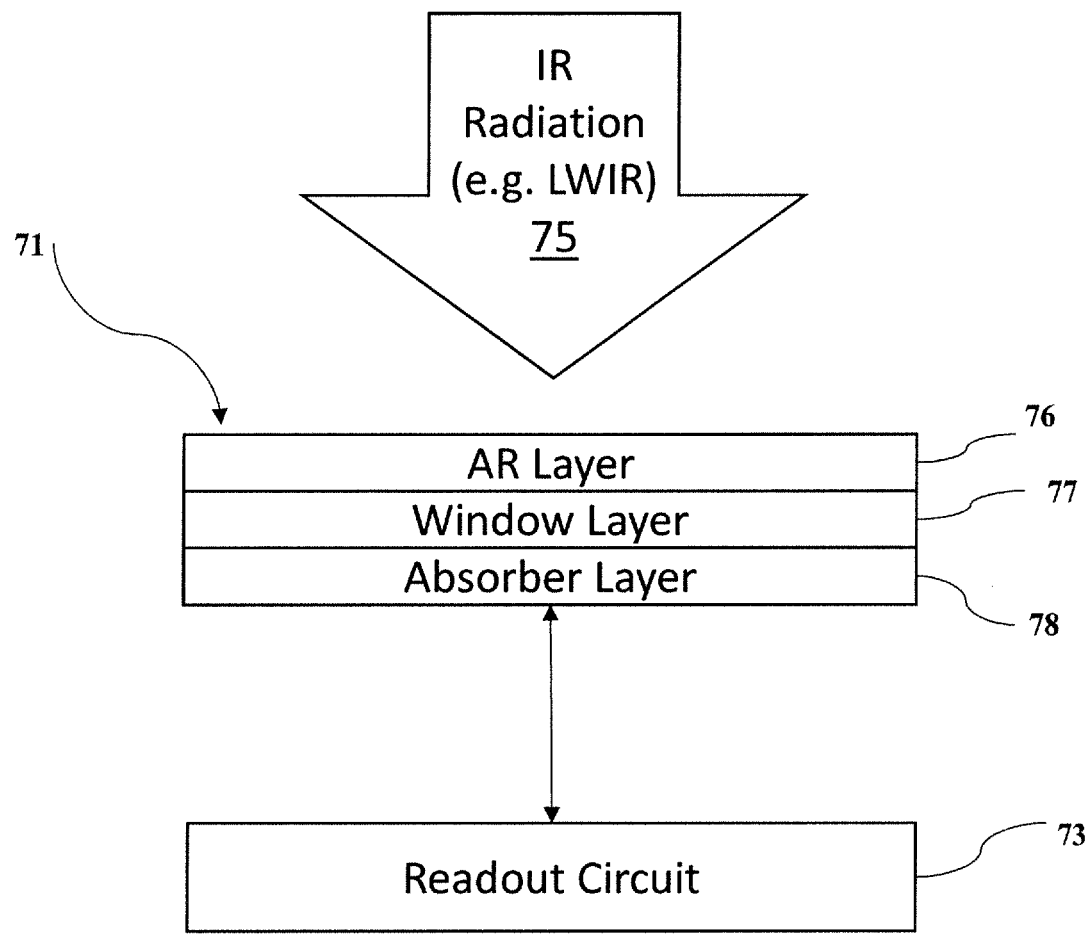
FIG. 17 is a schematic diagram of an example embodiment of the IR image sensor from the IR sensor device of FIG. 16.

Referring now to FIGS. 16-17, an IR sensor device 70 according to the present disclosure is now described. The IR sensor device 70 illustratively includes an IR image sensor 71 comprising an array 72 of IR sensing pixels, and a readout circuit 73 coupled to the IR image sensor and configured to sense a plurality of sequential images. The IR image sensor 71 may comprise one or more of a LWIR sensor, a SWIR sensor, and a MWIR sensor. The IR image sensor 71 may comprise a SLS made from InAs, GaSb, or other III-V semiconductor compounds, and their combinations. The IR image sensor 71 may be configured to sense sequential images at an operational frequency range of 30-240 Hz.

The IR sensor device 70 illustratively comprises a controller 74 coupled to the readout circuit 73 and configured to cause the readout circuit to apply a voltage to the IR image sensor 71 between sensing of the plurality of sequential images of the received IR radiation 75 (e.g. LWIR, SWIR, MWIR). Of course, in some embodiments, the sensed IR radiation may comprise one or more of LWIR, MWIR, SWIR, and near-infrared (NIR). As will be appreciated, the readout circuit 73 may comprise a typical readout integrated circuit (ROIC) configured with the teachings disclosed herein.

The controller 74 is configured to cause the readout circuit 73 to apply the voltage comprising a forward bias voltage to the IR image sensor 71. The readout circuit 73 may be configured to apply the voltage with a voltage value less than 0.75 Volts (or as low as 100 mV, i.e. 0.100-0.75 Volts). For example, the readout circuit 73 is configured to apply the voltage to generate a current density less than 1 mA/cm$^2$.

In some embodiments, the controller 74 is configured to cause the readout circuit 73 to apply the voltage periodically between sensing of the plurality of sequential images. In other words, the voltage treatment is applied on a predefined schedule. For example, in embodiments where the scanning frequency of the IR image sensor 71 is 30 Hz, the periodic schedule may comprise 1 ms intervals at 30 Hz repetition rate (i.e. 1 ms applications of the voltage between sensed frames).

Additionally, the IR image sensor 71 comprises an antireflective layer 76, a window layer 77 below the antireflective layer, and an absorber layer 78 below the window layer. The readout circuit 73 is configured to apply the voltage to forward bias injection of minority carriers into the absorber layer 78.

Figure 18:
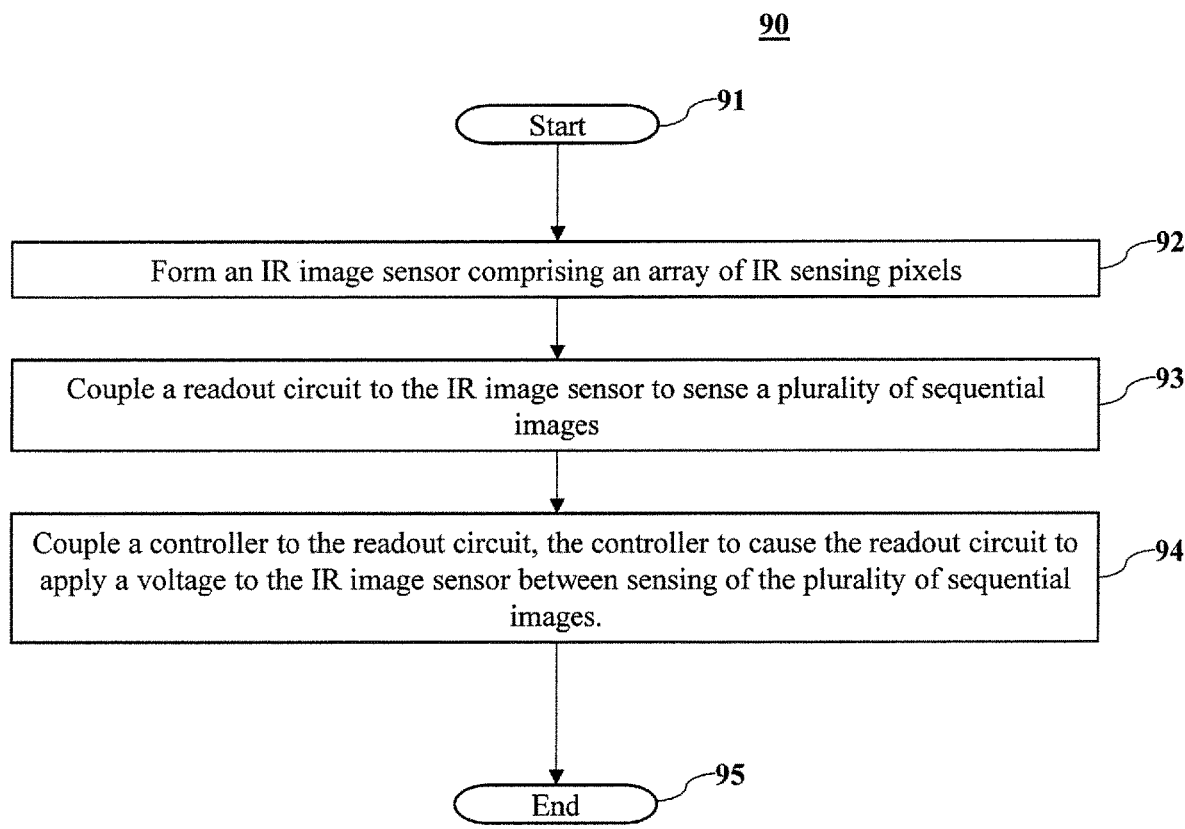
FIG. 18 is a flowchart for a method for making the IR sensor device of FIG. 16.

Referring now additionally to FIG. 18 and a flowchart 90 therein, a method for making the IR sensor device 70 is now described. (Block 91). The IR sensor device 70 is capable of mitigating radiation damage during operation. The method includes forming an IR image sensor 71 comprising an array 72 of IR sensing pixels, and coupling a readout circuit 73 to the IR image sensor and configured to sense a plurality of sequential images. (Blocks 92-93). The method comprises coupling a controller 74 to the readout circuit 73, the controller configured to cause the readout circuit to apply a voltage to the IR image sensor 71 between sensing of the plurality of sequential images. (Blocks 94-95).

Figure 19:
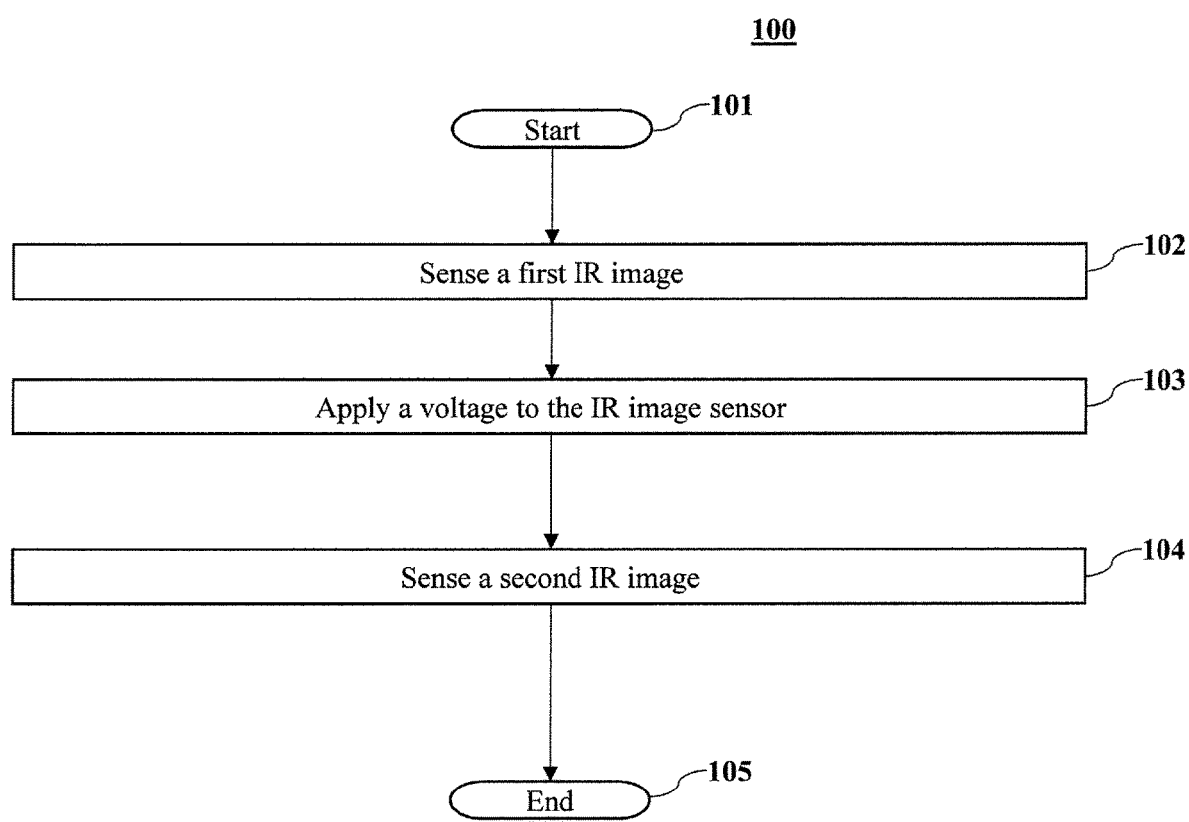
FIG. 19 is a flowchart for a method for operating the IR sensor device of FIG. 16.

Referring now additionally to FIG. 19 and a flowchart 100 therein, a method for operating the IR sensor device 70 is now described. (Block 101). The IR sensor device 70 includes an IR image sensor 71 comprising an array 72 of IR sensing pixels, and a readout circuit 73 coupled to the IR image sensor and configured to sense a plurality of sequential images. The IR sensor device 70 includes a controller 74 coupled to the readout circuit 73. The IR sensor device 70 is capable of mitigating radiation damage during operation with the method. The method includes operating the readout circuit 73 to apply a voltage to the IR image sensor 71 between sensing of the plurality of sequential images. (Blocks 102-105).

Advantageously, the IR sensor device 70 may mitigate radiation damage incurred during certain application, such a space deployment in orbit. The application of the voltage as described herein recovers the lost photoresponse from the radiation damage. Since the voltage value is well within typical voltage ranges of typical ROICs, the teachings herein do not require hardware customization. Indeed, since the teachings can be applied via the controller 74, the mitigation may be executed remotely, which is helpful for space applications.

REFERENCES (ALL INCORPORATED BY REFERENCE IN THEIR ENTIRETY)

1. A Khoshakhlagh, E Plis, S Myers, Y D Sharma, L R Dawson, S Krishna, "Optimization of InAs/GaSb type-II superlattice interfaces for long-wave (~8 μm) infrared detection," J. Crystal Growth 311, 1901 (2009).
2. M Razeghi, D Hoffman, B M Nguyen, P Y Delaunay, E K W Huang, M Z Tidrow, and V Nathan, "Recent Advances in LWIR Type-II InAs/GaSb Superlatice Photodetectors and Focal Plane Arrays at the Center for Quantum Devices," Proc. IEEE 97, 1056 (2009).
3. J E Hubbs, V Nathan, M Tidrow, M Razeghi, "Radiometric characterization of long-wavelength infrared type II strained layer superlattice focal plane array under low-photon irradiance conditions," Optical Eng. 51, 064002-1 (2012).
4. A Khoshakhlagh, L Hoglund, D Z Ting, C J Hill, S A Keo, A Soibel, J Nguyen, and S D Gunapala, "High performance long-wave type-II superlattice infrared detectors," J. Vac. Sci. Technol. B 31, 03C122-1 (2013).
5. A Soibel, S B Rafol, A Khoshakhlagh, J Nguyen, L Hoglund, S A Keo, J M Mumolo, J Liu, A Liao, DZ-Y Ting, and S D Gunapala, "Long Wavelength Infrared Superlattice Detectors and FPAs Based on CBIRD Design," IEEE Phot. Tech. Lett. 25, 875 (2013).
6. V M Cowan, C P Morath, J E Hubbs, S Myers, E Plis, and S Krishna, "Radiation tolerance characterization of dual band InAs/GaSb type-II strain-layer superlattice pBp detectors using 63 MeV protons," Appl. Phys. Lett. 101, 251108 (2012).
7. A Soibel, S B Rafol, A Khoshaklagh, J Nguyen, L Hoglund, A M Fisher, S A Keo, DZ-Y Ting, and S D Gunapala, "Proton radiation effect on performance of InAs/GaSb complementary barrier infrared detector," Appl. Phys. Lett. 107, 261102 (2015).
8. E A Garduno, V M Cowan, G D Jenkin, C P Morath, and E H Steenbergen, "Comparison of Pre- and Post-Irradiation Low-Frequency Noise Spectra of Midwave Infrared nBn Detectors With Superlattice Absorbers," IEEE Trans. Nuclear Sci. 64, 1042 (2017)
9. M H Weiler, G J Tarnowski, "Characterization of HgCdTe P-on-n Heterojunction Photodiodes and Their Defects Using Variable-Area Test Structures," J. Electron. Mat. 26, 635 (1997).
10. S Buchner et al. "Proton Test Guideline Development-Lessons Learned" NASA/Goddard Space Flight Center, NEPP, August 2002.
11. J L Barth, C S Dyer, and E G Stassinopoulos. "Space, atmospheric, and terrestrial radiation environments," IEEE Trans. Nuclear Sci. 50, 466 (2003).
12. M Robbins, Surrey Satellite Technology Ltd. Displacement Damage Guideline (2014).
13. G R Hopkinson, C J Dale, P W Marshall, "Proton effects in charge-coupled devices," IEEE Trans. Nuclear Sci. 43, 614 (1996).
14. J E Hubbs, "Proton Radiation Experimental Results on an III-V nBn Mid-Wavelength Infrared Focal Plane Array," Proc. SPIE 9933, 993307 (2016).
15. physics.nist.gov/PhysRefData/Star/Text/PSTAR.html
16. R E Peale, C J Fredricksen et al., "Planetary atmospheres minor species sensor balloon flight test to near space," Proc. SPIE 9491-14 (2015).
17. E Monroy et al., "Analysis and modelling of AlGaN-based Schottky barrier photodiodes," J. Appl. Phys. 88, 2081 (2000).

18. L Chernyak, W Burdett, "Electron injection-induced effects in GaN: Physics and Applications", MRS Spring Meeting Proc. 764, C5.4 (2003).
19. L Chernyak et al., "Electron Beam Induced Current Measurements of Minority Carrier Diffusion Length in Gallium Nitride, Appl. Phys. Lett. 69, 2531 (1996).
20. J Z Li, J Y Lin, H X Jiang, A Salvador, A Botchkarev, and H Morkoc, "Nature of Mg impurities in GaN", Appl. Phys. Lett. 69, 1474 (1996).
21. L Chernyak et al., "Phototransistor measurements in AlGaN/GaN HBTs", Electron. Lett. 37, 1411 (2001).
22. DZ-Y Ting, C. J. Hill, A. Soibel, S. A. Keo, J. M. Mumolo, J. Nguyen, S. D. Gunapala, "A high-performance long wavelength superlattice complementary barrier infrared detector," Appl. Phys. Lett. 95, 023508 (2009).
23. DZ-Y Ting, A Soibel, C J Hill, J Nguyen, S A Keo, S B Rafol, B H Yang, M C Lee, J M Mumolo, J K Liu, L Hoglund, S D Gunapala, "Antimonide superlattice complementary barrier infrared detector (CBIRD)," Infrared Phys. Tech. 53, 267 (2011).
24. L Höglund, D. Z. Ting, A. Soibel, A. Fisher, A. Khoshakhlagh, C. J. Hill, S. Keo, S. D. Gunapala, "Minority carrier lifetime in mid-wavelength infrared InAs/InAsSb superlattices: photon recycling and the role of radiative and Shockley-Read-Hall recombination mechanisms," Appl. Phys. Lett. 105, 193510 (2014).
25. C P Morath, V M Cowan, L A Treider, G D Jenkins, and J E Hubbs, "Proton Irradiation Effects on the Performance of III-V-Based, Unipolar Barrier Infrared Detectors," IEEE Trans. Nucl. Sci. 62, 512 (2015).
26. H S Kim, G D Bishop, J B Rodriguez, Y Sharma, E Plis, L R Dawson, and S Krishna, "Suppressed Surface Leakage Current Using nBn Infrared Detector Based on Type II InAs/GaSb Strain Layer Superlattices," LEOS 2007.
27. E Plis, J B Rodriguez, G Balakrishnan, Y D Sharma, H S Kim, T Rotter, S Krishna, "Mid-infrared InAs/GaSb strained layer superlattice detectors with nBn design grown on a GaAs substrate," Semiconductor Sci. Tech. 25, 085010 (2010).
28. J B Rodriguez, E Plis, G Bishop, Y D Sharma, H Kim, L R Dawson, and S Krishna, "nBn structure based on InAs/GaSb type-II strained layer superlatices," Appl. Phys. Lett. 91, 043514 (2007).
29. J Lee, C Fredricksen R Peale, L, Chernyak et al., "Impact of temperature and gamma radiation on electron diffusion length and lifetime in p-type InAs/GaSb superlattices," Appl. Phys. Lett. Manuscript under review by MDA for public release (2017).
30. V M Cowan, C P Morath, S M Swift, S Myers, N Gautam, and S Krishna, "Gamma-ray Irradiation Effects on InAs/GaSb-based nBn IR Detector." Proc. SPIE 7945 (2011).
31. E M Jackson, E H Aifer, C L Canedy, J A Nolde, C D Cress, B D Weaver, I Vurgaftman, J H Warner, J R Meyer, J G Tischler, S A Shaw, and C R Dedianous, "Radiation Damage in Type II Superlattice Infrared Detectors," J. Electron. Mat. 39, 852 (2010).
32. B. Ravinarayana Bhat, N. Upadhyaya, and R. Kulkarmi, "Total Radiation Dose at Geostationary Orbit," IEEE Trans. Nuclear Science, 52, 530 (2005).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An infrared (IR) sensor device comprising:
an IR image sensor comprising an array of IR sensing pixels;
a readout circuit coupled to said IR image sensor and configured to sense a plurality of sequential images; and
a controller coupled to said readout circuit and configured to cause said readout circuit to apply a plurality of voltage pulses to said IR image sensor between sensing of the plurality of sequential images to mitigate radiation damage to said IR image sensor.

2. The IR sensor device of claim 1 wherein each voltage pulse comprises a forward bias voltage pulse.

3. The IR sensor device of claim 1 wherein said controller is configured to cause said readout circuit to apply the plurality of voltage pulses periodically between sensing of the plurality of sequential images.

4. The IR sensor device of claim 1 wherein said IR image sensor comprises an anti-reflective layer, a window layer below said anti-reflective layer, and an absorber layer below said window layer.

5. The IR sensor device of claim 4 wherein said readout circuit is configured to apply the plurality of voltage pulses to forward bias injection of minority carriers into said absorber layer.

6. The IR sensor device of claim 1 wherein said readout circuit is configured to apply the plurality of voltage pulses to generate a current density less than 1 $mA/cm^2$.

7. The IR sensor device of claim 1 wherein said readout circuit is configured to apply the plurality of voltage pulses with a voltage value less than 0.75 Volts.

8. The IR sensor device of claim 1 wherein said IR image sensor comprises at least one of a long-wave infrared (LWIR) sensor, a mid-wave infrared (MWIR) sensor, and a short wave infrared (SWIR) sensor.

9. The IR sensor device of claim 1 wherein said IR image sensor comprises a Strained-Layer-Superlattice (SLS) made from InAs, GaSb, or other III-V semiconductor compounds, and their combinations.

10. An infrared (IR) sensor device comprising:
an IR Strained-Layer-Superlattice (SLS) image sensor image sensor comprising an array of IR sensing pixels;
a readout circuit coupled to said IR SLS image sensor and configured to sense a plurality of sequential images; and
a controller coupled to said readout circuit and configured to cause said readout circuit to apply a plurality of forward bias voltage pulses to said IR SLS image sensor periodically between sensing of the plurality of sequential images to mitigate radiation damage to said IR image sensor.

11. The IR sensor device of claim 10 wherein said IR SLS image sensor comprises an anti-reflective layer, a window layer below said anti-reflective layer, and an absorber layer below said window layer.

12. The IR sensor device of claim 11 wherein said readout circuit is configured to apply the plurality of forward bias voltage pulses to forward bias injection of minority carriers into said absorber layer.

13. The IR sensor device of claim 10 wherein said readout circuit is configured to apply the plurality of forward bias voltage pulses to generate a current density less than 1 $mA/cm^2$.

14. The IR sensor device of claim 10 wherein said readout circuit is configured to apply the plurality of forward bias voltage pulses with a voltage value less than 0.75 Volts.

15. The IR sensor device of claim 10 wherein said IR SLS image sensor comprises at least one of a long-wave infrared (LWIR) sensor, a mid-wave infrared (MWIR) sensor, and a short wave infrared (SWIR) sensor.

16. The IR sensor device of claim 10 wherein a SLS of said IR SLS image sensor is made from InAs, GaSb, or other III-V semiconductor compounds, and their combinations.

17. A method for making an infrared (IR) sensor device, the IR sensor device to mitigate radiation damage, the method comprising:

forming an IR image sensor comprising an array of IR sensing pixels;

coupling a readout circuit to the IR image sensor and configured to sense a plurality of sequential images; and coupling a controller to the readout circuit, the controller configured to cause the readout circuit to apply a plurality of voltage pulses to the IR image sensor between sensing of the plurality of sequential images to mitigate radiation damage to the IR image sensor.

18. The method of claim 17 wherein each voltage pulse comprises a forward bias voltage pulse.

19. The method of claim 17 wherein the controller is configured to cause the readout circuit to apply the plurality of voltage pulses periodically between sensing of the plurality of sequential images.

20. The method of claim 17 wherein the IR image sensor comprises a Strained-Layer-Superlattice (SLS) made from InAs, GaSb, or other III-V semiconductor compounds, and their combinations.

* * * * *